(12) United States Patent
Choudhury et al.

(10) Patent No.: US 6,725,404 B1
(45) Date of Patent: Apr. 20, 2004

(54) EVALUATION OF INTERCONNECT RELIABILITY USING PROPAGATION DELAY THROUGH INTERCONNECT

(75) Inventors: Apurba Choudhury, Rochester, MN (US); Thomas Wen Liang, Rosemount, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/580,782

(22) Filed: May 26, 2000

(51) Int. Cl.[7] .............................................. G01R 31/28
(52) U.S. Cl. ...................................... 714/724; 714/715
(58) Field of Search ................................. 714/731, 724, 714/715; 324/617, 765, 628; 385/24

(56) References Cited

U.S. PATENT DOCUMENTS

| | | | | |
|---|---|---|---|---|
| 4,893,072 A | * | 1/1990 | Matsumoto | 714/731 |
| 5,448,661 A | * | 9/1995 | Takai et al. | 385/24 |
| 5,568,576 A | * | 10/1996 | Takai et al. | 385/24 |
| 5,715,339 A | * | 2/1998 | Takai et al. | 385/24 |
| 5,867,030 A | * | 2/1999 | Sato | 324/617 |
| 6,369,601 B1 | * | 4/2002 | Ishigaki | 324/765 |
| 6,415,402 B2 | * | 7/2002 | Bishop et al. | 714/724 |
| 6,433,558 B1 | * | 8/2002 | Sciacero et al. | 324/628 |

* cited by examiner

*Primary Examiner*—David Ton
(74) *Attorney, Agent, or Firm*—Wood, Herron & Evans LLP

(57) ABSTRACT

An apparatus and method for reliability testing an electrical connector for an unacceptable propagation delay. The propagation delay is detected in a transmitted test signal through the electrical connector in comparison to a reference signal having a known delay. A failure signal occurs in response to the transmitted test signal failing to transition before a corresponding transition in the reference signal. The apparatus and method is extendable to a plurality of conductor paths in the electrical connector, such as a parallel communication digital data bus. Moreover, the known delay in the reference signal is selectable for adjusting an allowable propagation delay criteria for applications with different data rate requirements.

19 Claims, 3 Drawing Sheets

EVALUATION OF INTERCONNECT RELIABILITY USING PROPAGATION DELAY THROUGH INTERCONNECT

FIELD OF THE INVENTION

The invention is generally related to functionally testing an electrical connector, and in particular, to testing a digital data bus electrical connector for reliability.

BACKGROUND OF THE INVENTION

Many systems and networks of systems rely upon the communication of digital data along electrical transmission lines. The digital data has a predetermined data rate during which an electrical signal composed of pulses selectively varies between high and low voltage levels. These transmission lines interconnect all levels of electronics from integrated circuit, module, system, and network. Even systems that convey digital data in a radiant form of energy such as visible light in a fiber or radio frequency (RF) broadcast still depend in part on electrical transmission lines for a portion of the communication.

Typically, an electrical signal has clearly defined rising and falling edges that must transition within a predetermined amount of time for correct reception. Often, the electrical signal is clocked such that a data bit is transmitted at each transition of a clock signal. Failure of the electrical signal to transition from a high voltage level to a low voltage, or the reverse, prior to an associated clock signal transition results in the incorrect digital state (e.g., 1 rather than 0) being received.

The ability of an electrical transmission line to transmit data in a timely manner is often affected by the impedance in the line. Impedance is often considered to incorporate a resistive component and a reactive component, and can result in distortions in an electrical signal that delay signal transitions and potentially create data transmission errors.

Increasingly, higher data rates are used in electrical transmission lines. As such, the time frame that transitions in a signal must be received continues to decrease, making impedance an ever-increasing concern for digital transmission systems. Consequently, distortion of the electrical signal may impose an upper limit on the data rate that may be achieved within a given transmission line.

Certain types of electrical components within an electrical transmission line can affect impedance levels and line reliability. For example, faulty electrical connectors, or interconnects, can often introduce unacceptable impedance levels into an electrical transmission line. The physical mechanism for such unacceptable impedance in an electrical connector may be a reduced conducting surface area between electrical contacts due to variations in manufacturing, contamination, and material wear. With the reduced conducting surface area, the resistive nature of the electrical connector increases. This increase in resistance aggravates any reactive characteristics of the electrical connector. In addition, the reduced coupled surface area may also increase the capacitance of the electrical connector, given the increase in closely spaced, uncoupled surface areas surrounding the coupled surface area.

Because of these variations in electrical connectors, there exists a need for ensuring that an electrical connector will perform reliably in various environments. Reliability testing is often necessary since the variations may be difficult to overcome by other means, such as by choice of electrical connector design. Moreover, an electrical connector design may require validation in a different environment.

It is generally known to estimate reliability of an electrical connector by "glitch detecting", in which a DC voltage is used to measure changes in resistance over time. If an electrical connector has a resistance value that varies more than 10 milli-Ohms (m$\Omega$), then a failure is deemed to have occurred, based on a belief that a 10 m$\Omega$ variation means that 90% of the contact area has been lost. Reliability testing with a glitch detector is a coarse pass/fail test and not a direct indication of the suitability of an electrical connector to a specific application.

Even assuming that measuring variation in resistance of an electrical connector indicates reliability, generally known glitch detectors are subject to a number of sources of inaccuracy in measuring resistance. As the data rates required of electrical connectors increases, glitch detectors have to measure minute variations in resistance that last for correspondingly shorter periods of time. At these short durations, the resistance measurements are increasingly subject to electromagnetic interference (EMI), and thus cumbersome EMI shielding techniques must be employed.

Consequently, a significant need exists for a testing technique of an electrical connector that indicates whether a desired data rate may be reliably transmitted by the connector.

SUMMARY OF THE INVENTION

The invention addresses these and other problems associated with the prior art by providing a test apparatus and method of determining the reliability and/or suitability of an electrical connector for use at a desired data rate by sensing a propagation delay imposed by the electrical connector on a test signal.

In one aspect consistent with the invention, a test apparatus includes a connector interface and a test circuit. The test circuit generates a test signal that is transmitted through an electrical connector via the connector interface. The test circuit determines the reliability of the electrical circuit by determining a propagation delay imposed on the test signal by the electrical connector.

In another aspect consistent with the invention, a method of testing an electrical connector for reliability includes interfacing a test signal path to through the electrical connector, transmitting a test signal along the test signal path through the electrical connector, and detecting a propagation delay in the test signal after it has been transmitted through the electrical connector.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
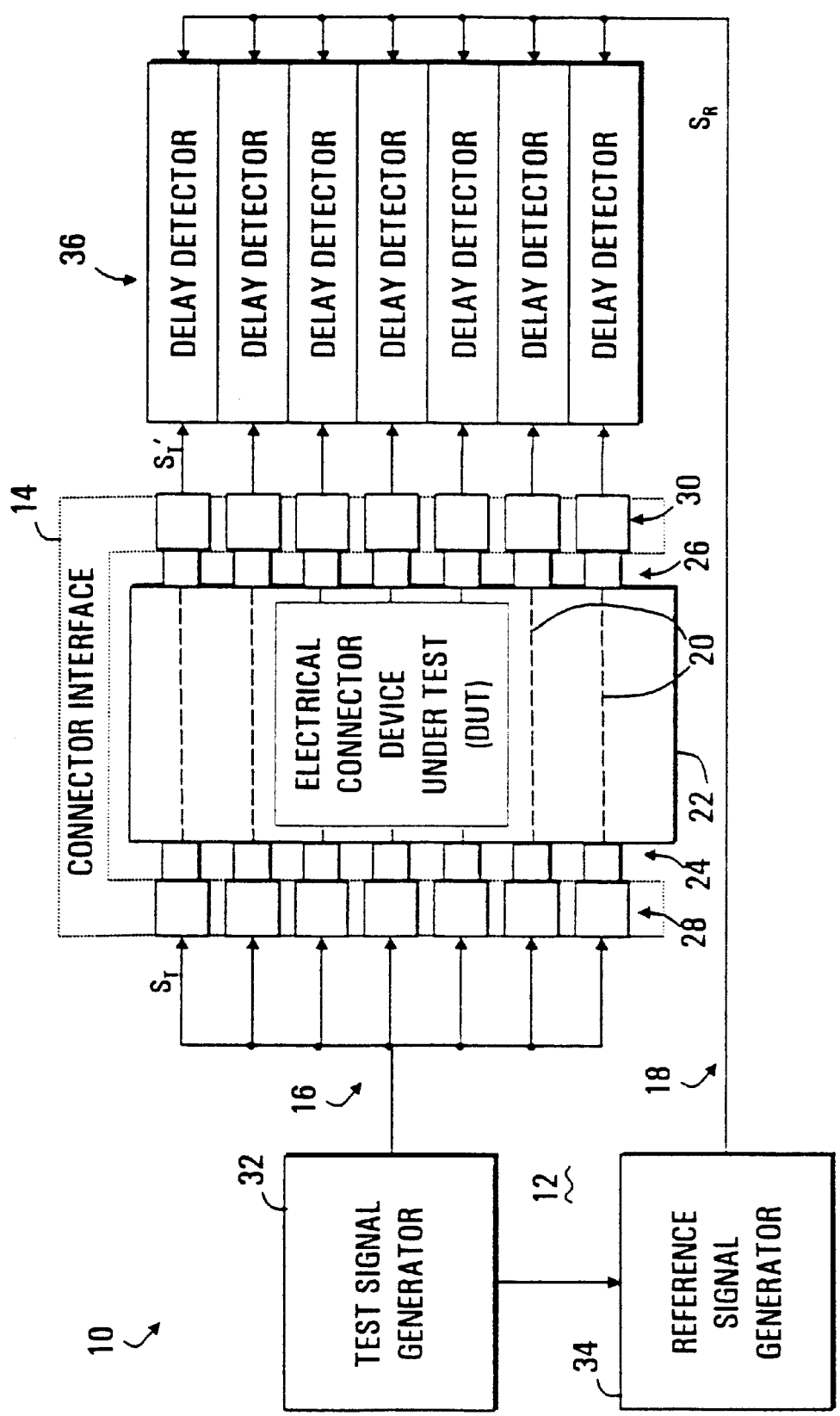
FIG. 1 is block diagram of a test apparatus consistent with the invention, shown interfaced with an electrical connector under test.

Turning to the Drawings, wherein like numbers denote like parts throughout the several views, FIG. 1 illustrates a test apparatus 10 that includes a test circuit arrangement 12 and a connector interface 14. The test circuit arrangement 12 has a plurality of test signal paths 16 and a reference signal path 18. The plurality of test signal paths 16 correspond to a plurality of electrical connector conduction paths 20 that are to be tested, depicted as being part of an electrical connector 22 functioning as a device under test (DUT).

Each conduction path 20 begins respectively with a first connector contact 24 and terminates respectively at a second connector contact 26. The connector interface 14 couples to the electrical connector 22 respectively via first test contacts 28 for the first connector contacts and second test contacts 30 for the second connector contacts.

A test signal generator 32 transmits a test signal $S_T$ through the test signal paths 16. A reference signal generator 34, synchronized to the test signal generator 32, transmits a reference signal $S_R$ through the reference signal path 18. Each test signal path 16 terminates at a delay detector 36 that compares a transmitted test signal $S_T'$ that has been transmitted through the electrical connector 22 with the reference signal $S_R$ to detect a propagation delay.

It should be appreciated by those having skill in the art having the benefit of the instant disclosure that for clarity the number of test signal paths 16 illustrated in FIG. 1 corresponds directly to the number of electrical connector conduction paths 20. However, it is consistent with aspects of the invention for the number of number of test signal paths 16 not to correspond to the number of electrical connector conduction paths 20. In these instances, excess test signal paths 16 may be ignored or excess electrical connector conduction paths 20 tested sequentially rather than in parallel.

Moreover, the connector interface 14 may include a multiplexing circuit whereby one test signal $S_T$ from the test signal generator 32 is sequentially sent through each conduction path 20. Furthermore, the connector interface 14 may include a demultiplexing circuit that allows each of the conduction paths 20 to be sequentially delay detected by one delay detector 36.

Furthermore, although a single reference signal and a single test signal is illustrated for clarity, a plurality of reference signals and test signals may be used. For example, different conduction paths 20 within the electrical connector may be tested for a different acceptable propagation delay. As another example, the plurality of test signals and reference signals may be sequentially multiplexed for each conduction paths 20. The plurality of test signals and reference signals may be selected to represent a various operating data rates, power levels, etc., to further characterize the electrical connector 22.

In addition, the electrical connector 22 may represent a combination of components including transmission lines and additional electrical connectors.

Figure 2:
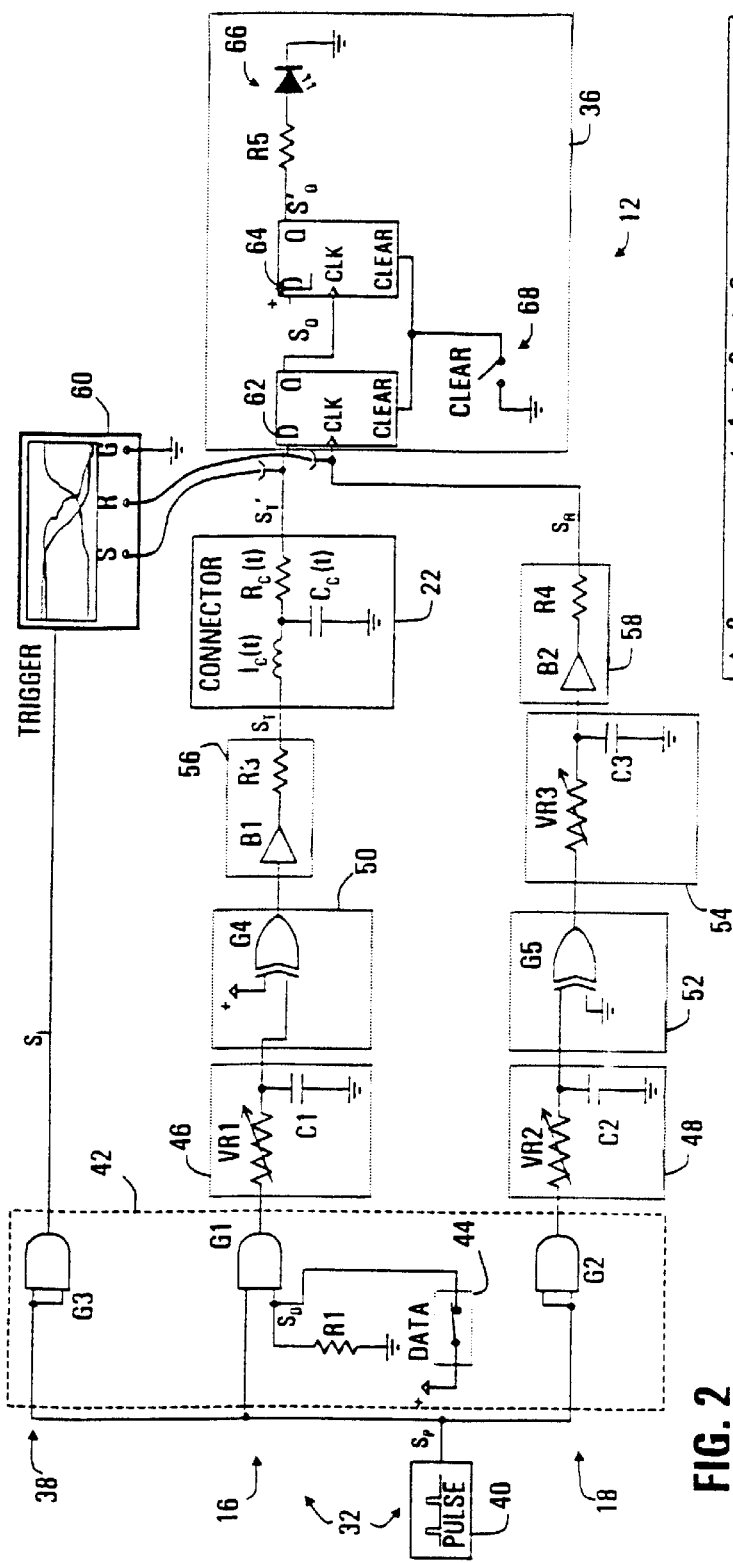
FIG. 2 is a schematic diagram of one implementation of the test apparatus of FIG. 1.

Referring to FIG. 2, one illustrative implementation of the test apparatus 10 of FIG. 1 is depicted for reliability testing the electrical connector 22 intended for a digital data transmission line. A single test signal path 16 is shown for clarity along with a reference signal path 18, although a plurality of test signal paths 16 and corresponding delay detectors 36 may be included.

In addition, an instrumentation signal path 38 for generating an instrumentation signal $S_I$ parallels the other paths 16, 18 for tuning the test circuit apparatus 12. The instrumentation signal path 38 may be used to empirically determine the suitability of an electrical connector 22 for a specific application without necessarily having to determine what electrical characteristics of the connector 22 are required. "End-to-end testing" an electrical connector 22 achieved by delay testing may more accurately reflect reliability and avoid the sources of inaccuracy inherent in conventional testing techniques.

A pulse generator 40 provides a pulsed signal $S_P$ as a common excitation for the test signal $S_T$ the test signal path 16, the reference signal $S_R$ in the reference signal path 18, and the instrumentation signal $S_I$ in the instrumentation signal path 38. Thus, the paths 16, 18, 38 are referenced to one another. The pulse generator 40 in combination with the portions of the test signal path 16 described below thus form the test signal generator 32. Similarly, the pulse generator 40 in combination with portions of the reference signal path 18 described below form the reference signal generator 34.

The test circuit arrangement 12 advantageously includes a data enable circuit arrangement 42 that interrupts the pulsed signal $S_P$, and thus the test signal $S_T$, in the test signal path 16. In the illustrative test circuit arrangement 12, the data enable circuit arrangement 42 does not interrupt the reference signal path 18 and instrumentation signal path 38 so that the test circuit arrangement 12 may be tuned with the electrical connector 22 electrically isolated. In some instances, the power levels required to adequately test the electrical connector 22 may be high enough to cause safety consideration or to alter test results over time due to heating. Consequently, the data enable circuit arrangement 42 allows partial activation of the test circuit arrangement 12 for test preparation without necessarily transmitting through the electrical connector 22.

The data enable test circuit arrangement 42 includes an AND logic gate G1 in the test signal path 16. The AND logic gate G1 receives the pulsed signal $S_P$ at a first input and a data signal $S_D$ at a second input. The data signal $S_D$ goes to a high logic when DATA ON is desired by closing a data switch 44 that couples the second input to a power supply. A pull-down resistor R1 is coupled between the second input and ground.

In order to preserve the synchronization of the pulsed signal $S_P$ in each path 16, 18, and 38, the reference signal path 18 includes an AND logic gate G2 that receives the pulsed signal $S_P$ at both of its inputs. Also, the instrumentation signal path 38 has an AND logic gate G3 that receives the pulsed signal $S_P$ at both of its inputs.

The test circuit arrangement 12 includes low pass filtering of the pulsed signal $S_P$ in both the test signal path 16 and reference signal path 18. The low pass filtering serves to reduce noise as well as to introduce a predetermined delay into the reference signal $S_R$ relative to the test signal $S_T$. A test signal filter 46 filters a data enabled test signal from AND logic gate G1 in the test signal path 16. The test signal filter 46 is formed from a series variable resistor VR1 terminated with a capacitor C1 that is coupled to ground. A first reference signal filter 48 filters a signal from the AND logic gate G2 in the reference signal path 18. The first reference signal filter 48 is formed from a series variable resistor VR2 terminated with a capacitor C2 that is coupled to ground.

In addition to delaying the reference signal $S_R$ relative to the test signal $S_T$, the reference signal $S_R$ is also inverted relative to the test signal $S_T$. This allows an illustrative delay detector 36 described below to respond to the failure of the test signal $S_T'$ to complete a transition by the time that the reference signal $S_R$ completes its transition after the known delay.

The test signal path 16 thus includes an inverter 50 formed from a NOR logic gate G4 that receives at one input a signal from the first test signal filter 46. The NOR logic gate G4 has a second input coupled to the power supply.

In order to maintain the timing relationship between the paths 16, 18, a buffer 52 is formed from a NOR logic gate G5 in the reference signal path 18 receives a signal from the reference signal filter 48 at a first input. The NOR logic gate G5 has a second input coupled to ground. The buffer 52 provides a delay that corresponds to a delay by the inverter 50.

The output of the buffer 52 thereafter receives additional filtering and delay by a second reference signal filter 54 in the reference signal path 18. The filter 54 is formed from a series variable resistor VR3 terminated in a capacitor C3 coupled to ground.

A first transmission line emulator 56 in the test signal path 16 further conditions the test signal $S_T$ prior to transmission through the electrical connector 22. The emulators 56, 58 may advantageously convert voltage and current levels to be representative of the application. In addition, the transmission line emulator 56 may assist in end-to-end testing by introducing the fixed delay expected in an application. For example, the emulator 56 is formed from a series of a bus driver B1 coupled to a series resistor R3.

Similarly, the reference signal path 18 includes a second transmission line emulator 58 formed from a series of a bus driver B2 coupled to a series resistor R4. In some instances, either or both of the transmission line emulators 56, 58 may include a predetermined length of transmission line to introduce a fixed delay into either path 16, 18.

The test signal $S_T$ then transmits through the electrical connector 22 to be output as a transmitted test signal $S_T'$. The electrical connector 22 is depicted in FIG. 2 as comprising a time-varying, passive first-order RLC (i.e., Resistor-Inductor-Capacitor) circuit of a series inductor $I_C(t)$ and resistor $R_C(t)$, between which a capacitor $C_C(t)$ is coupled to ground. The pulsed nature of the test signal $S_T$ thus interacts with the impedance of the electrical connector performing an AC dynamic test, rather than just the resistive portion of the impedance as would a DC "glitch detection" test signal.

Tuning the test circuit arrangement 12 is illustrated by an oscilloscope plot 60 triggered by the instrumentation signal $S_I$ of the instrumentation signal path that is plotting the transmitted test signal $S_T'$ on one channel versus the reference signal $S_R$ on another channel. The oscilloscope 60 may be used when adjusting the variable resistors VR1, VR2, VR3 in preparation for reliability testing. For example, a known good electrical connector 22 may be installed, or a low impedance bypass of the electrical connector 22 be employed. The tuning of the variable resistors VR1, VR2, VR3 may then be accomplished to achieve a predetermined delay defined as the acceptable range, for instance.

The transmitted test signal $S_T'$ is input to the delay detector 36 for comparison with the reference signal $S_R$. In particular, a D flip flop 62 acts as a comparator by receiving the transmitted test signal $S_T'$ at a Data (D) input and the reference signal $S_R$ at a Clock (CLK) input. The output (Q) of the D flip flop 62 is an output signal $S_O$ that is set to the logic state of the Data (D) input at each rising edge of the Clock (CLK) input. For instance, the output signal $S_O$ remains logic=0 until the transmitted test signal $S_T'$ is still logic=1 when the reference signal $S_R$ triggers the D flip flop 62 with a rising edge transition to logic=1, in which case the output signal $S_O$ will be a logic=1 fault signal. Monitoring the output signal $S_O$ provides indications of intermittent failures since each subsequent cycle of the reference signal $S_R$ clears any fault signal from the output signal $S_O$.

In order to latch a failure signal for human monitoring or other purposes, the delay detector 36 has an indicator latch function. More particularly, a D flip flop 64 has a Data (D) input coupled to the power supply and a clock input (CLK) coupled to the output signal $S_O$ from the comparator D flip flop 62. Thus, a latched output signal $S_O'$ from the output (Q) of the indicator latch D flip flop 64 goes to logic=1 when a fault signal (logic=1) is present in the output signal $S_O$. The latched output signal $S_O'$ is current limited by a series resistor R5 and then biases a light emitting diode (LED) 66. A normally-open clear switch 68 is closed, coupling CLEAR inputs for both D flip flops 62, 64 to clear a latched indication of failure signal.

It should be appreciated by those skilled in the art having the benefit of the instant disclosure that each of the elements describe, and the order of the elements, may be omitted, or substituted with various known replacements. For example, other filtering circuit arrangements would also be appropriate, including active components and higher order filters. As a further example, the reference signal $S_R$ may be inverted rather than the test signal $S_T$. Also, no inversion may be required if using a delay detector that triggers on the signals having opposite logic states, one high and one low, for instance.

Figure 3:
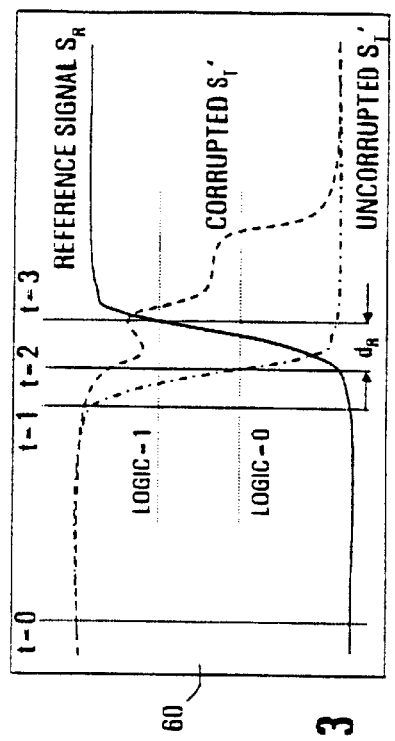
FIG. 3 is an illustrative plot of a transition in a reference signal compared to two transmitted test signals, one of which is uncorrupted and another one which is corrupted by an excessive propagation delay.

Referring to FIG. 3, the oscilloscope plot 60 illustrates the operation of the delay detector 36. At a time t=0, a trace for an uncorrupted test signal $S_T'$ is stable at a logic=1 state (i.e., greater than a logic=1 threshold), and a trace for a reference signal $S_R$ is stable at logic=0 state (i.e., less than a logic=0 threshold). At time t=1, the uncorrupted test signal $S_T'$ begins a transition from a logic=1 state to a logic=0 state. At time t=2, the uncorrupted test signal $S_T'$ has completed the transition to the logic=0 state.

The delay in the reference signal $S_R$ results in its transition continuing after time t=2, reaching logic=1 state at time t=3, at which point the state of the Data (D) is output (Q) of the comparator D flip flop 62. Since the uncorrupted test signal $S_T'$ is logic=0 at this point, the output signal $S_O$ does not indicate a failure. A reference delay $d_R$ between time=2 and time=3 indicates a time margin available for a slower transition in the test signal $S_T'$.

Depending on the application, the logic thresholds and upper and lower voltages of the test signal $S_T'$ and reference signal $S_R$ may vary. Consequently, the exact delay or low pass filtering necessary to achieve this reference delay $d_R$ would vary.

Also, a trace of a corrupted test signal $S_T'$ similarly begins a transition at time t=1, but has remained in a logic=1 state at time t=3 when the reference signal transitions to a logic=1 state. Consequently, the logic=1 state of the corrupted test signal $S_T'$ becomes a failure signal in the output signal $S_O$.

Figure 4:
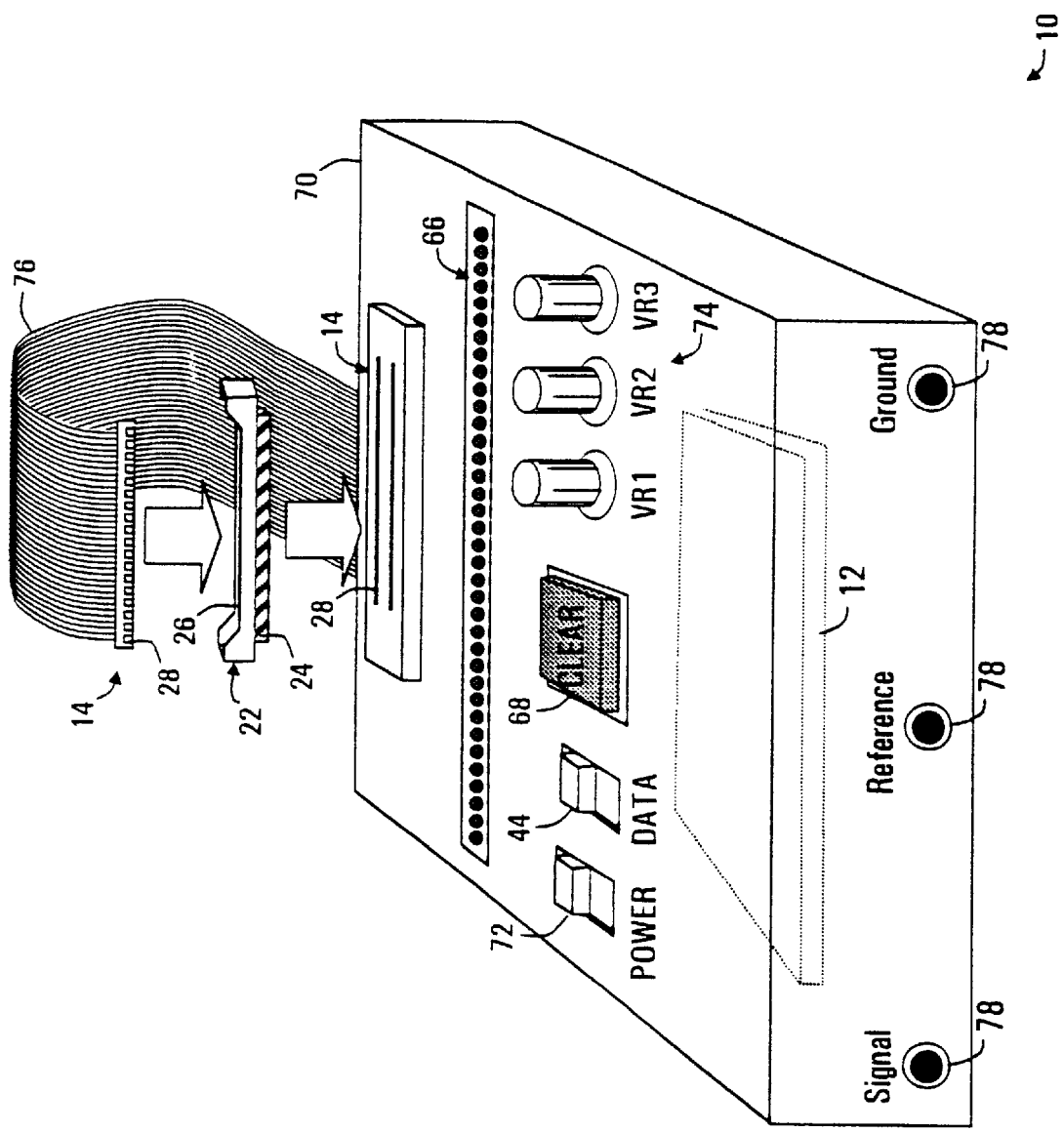
FIG. 4 is a perspective view of an exemplary test box of the test apparatus of FIG. 1.

Referring to FIG. 4, a test apparatus 10 illustrates an environment in which a user may test an electrical connector 22, such as DIMM socket. The test circuit arrangement 12 is enclosed within a housing 70. A power switch 72 enables power to reach the test circuit arrangement 12. A plurality of knobs 74 allows adjusting delay and filtering. A ribbon cable 76 is depicted as being part of the connector interface 14, which may be of a length for convenient installation of the electrical connector 22 and may further be a selectable feature for a desired transmission line length for a fixed delay. A plurality of plugs 78 for coupling to internal signal from the test circuit arrangement 12 allow displaying the internal signals on an oscilloscope 60 or other logic tester.

It should be appreciated by those skilled in the art having the benefit of the instant disclosure that it would be possible to provide additional features to the test apparatus 10.

For example, rather than relying upon a user to monitor LEDs 66, a data acquisition system may store, analyze and alert the user of an electrical connector found to be faulty or otherwise inadequate for an intended use.

As another example, the tuning of the known delay may be unnecessary, or provided by a selection of preset values that do not require display like an oscilloscope.

As an additional example, the test circuit arrangement 12 may be incorporated into an operational electrical connector 22 and transmission line arrangement so that periodic testing may be performed without removing the electrical connector 22 from its operational installation.

As yet a further example, although a digital electrical connector 22 is included in an illustrative version described herein, the electrical connector 22 may be used in an analog implementation, such as a base band audio electrical connector 22.

As another example, in some applications the electrical connector 22 may advantageously include an impedance that generates a desired attenuation or propagation delay. The test circuit may then include detection of a propagation delay that is too short in addition to, or as an alternative to, detection of a propagation delay that is too long.

Other modifications will be apparent to one of ordinary skill in the art. Therefore, the invention lies in the claims hereinafter appended.

What is claimed is:

1. A test apparatus for testing an electrical connector, the electrical connector including a first connector contact and a second connector contact, the first connector contact being in electrical communication with the second connector contact, the test apparatus comprising:
a connector interface including a first test contact and a second test contact, the connector interface configured to electrically couple the first test contact to the first connector contact and to electrically couple the second test contact to the second connector contact; and
a test circuit arrangement configured to determine the reliability of the electrical connector by determining propagation delay along a test signal path incorporating the electrical connector, wherein the test circuit arrangement includes:
a test signal generator operable for generating a test signal, the test signal path coupled to the test signal generator and configured to transmit the test signal through the electrical connector via the connector interface to produce a transmitted signal;
a reference signal generator operable for generating a reference signal; and
a delay detector coupled to the test signal path and the reference signal generator, the delay detector operable for detecting a delay in the transmitted signal relative to the reference signal.

2. The test apparatus of claim 1, wherein the reference signal is generated by the test signal generator, the reference signal including a known delay.

3. The test apparatus of claim 2, wherein the reference signal generator comprises a reference path coupling the test signal generator to the delay detector, the reference path including a reference delay operable to impart the known delay to the test signal to produce the reference signal.

4. The test apparatus of claim 3, wherein the reference delay includes one of a low pass filter and a length of transmission line.

5. The test apparatus of claim 3, wherein the delay detector includes a comparator operable for outputting a fault signal in response to a delay in the transmitted signal exceeding the known delay in the reference signal.

6. The test apparatus of claim 3, wherein the test signal generator comprises a pulse generator, the test signal comprising a digital pulse signal.

7. The test apparatus of claim 6, wherein the test signal path further includes a digital inverter operable to invert the test signal, the comparator comprising a D flip-flop including a Data input, a Clock input, and a Q output, the Data input coupled to the test signal path to receive the transmitted signal, the Clock input coupled to the reference path to receive the reference signal, the Q output providing the fault signal in response to an amplitude transition of the transmitted signal subsequent to an amplitude transition of the reference signal.

8. The test apparatus of claim 7, further comprising an indicator latch operable to output a latched fault signal in response to the fault signal of the comparator.

9. The test apparatus of claim 8, wherein the indicator latch comprises a D flip-flop including a Data input, Clock input, and a Q output; the Data input coupled to a logic 1 signal, the Clock input coupled to receive the fault signal from the comparator D flip-flop, the indicator latch D flip-flop operable to output the latched fault signal at the Q output in response to the fault signal.

10. The test apparatus of claim 9, further comprising an indicator responsive to the latched fault signal.

11. The test apparatus of claim 10, wherein the indicator comprises a Light Emitting Diode (LED).

12. The test apparatus of claim 6, wherein the test signal path includes a first transmission line emulator, and wherein the reference path includes a second transmission line emulator.

13. The test apparatus of claim 12, wherein each of the first and second transmission line emulators respectively comprises a buffer and resistor in a series combination.

14. The test apparatus of claim 1, further including a test enable circuit arrangement operable to selectably transmit the test signal through the electrical connector via the connector interface.

15. The test apparatus of claim 1, wherein the electrical connector comprises a digital bus electrical connector, the digital bus electrical connector including a plurality of first connector contacts and a corresponding plurality of second connector contacts in electrical communication therewith, the connector interface including corresponding pluralities of first and second test contacts, the test circuit arrangement including a corresponding plurality of test signal paths and delay detectors for each pair of the pluralities of first and second connector contacts.

16. A method of determining the reliability of an electrical connector, the electrical connector including a first connector contact and a second connector contact, the first connector contact in electrical communication with the second connector contact, the method comprising:
interfacing a test signal path to the first and second connector contacts of the electrical connector;

transmitting a test signal along the test signal path to the first connector contact; and detecting a propagation delay in a transmitted signal from the second connector contact, wherein detecting the propagation delay in the transmitted signal includes comparing the transmitted signal to a reference signal.

17. A method of determining the reliability of an electrical connector, the electrical connector including a first connector contact and a second connector contact, the first connector contact in electrical communication with the second connector contact, the method comprising:

interfacing a test signal path to the first and second connector contacts of the electrical connector;

transmitting a test signal along the test signal path to the first connector contact;

detecting a propagation delay in a transmitted signal from the second connector contact, wherein detecting the propagation delay in the transmitted signal includes comparing the transmitted signal to a reference signal;

transmitting the test signal along a reference path; and delaying the test signal by a known delay to form the reference signal.

18. The method of claim 17, wherein delaying the test signal includes low pass filtering the test signal.

19. The method of claim 17, wherein the test signal comprises a pulsed signal.

* * * * *